Benjamin M. Mikulis
Howard W. Wegener
*INVENTORS*

Dec. 13, 1960 B. M. MIKULIS ET AL 2,964,436

METHOD OF LAMINATING CONDUCTORS TO THERMOPLASTIC MATERIALS

Filed March 31, 1958 3 Sheets-Sheet 2

Benjamin M. Mikulis
Howard W. Wegener
INVENTORS

METHOD OF LAMINATING CONDUCTORS TO THERMOPLASTIC MATERIALS

Filed March 31, 1958 3 Sheets-Sheet 3

Benjamin M. Mikulis
Howard W. Wegener
INVENTORS

1

2,964,436

METHOD OF LAMINATING CONDUCTORS TO THERMOPLASTIC MATERIALS

Benjamin M. Mikulis and Howard W. Wegener, Nashua, N.H., assignors to Sanders Associates, Inc., Nashua, N.H., a corporation of Delaware Filed Mar. 31, 1958, Ser. No. 724,937

6 Claims. (Cl. 154—2.21)

The present invention relates to printed circuit articles, such as flexible cabling utilizing copper conductors bonded to a wide range of plastic materials. More particularly, this invention relates to a method of laminating, in a predetermined configuration, flexible printed circuit conductors to a thermoplastic material.

Typically, flexible, printed circuit cables are formed from flat, relatively thin sheets of plastic material having embedded therein flat, thin conductors all in the same plane, or, at most, in a few superimposed planes. In one form of such a cable, the conductors are of uniform width and are separated uniformly. The present invention is directed to an improvement in such printed circuits by providing a solution for the problems arising from expansion of the circuitry during lamination. In the past, flexible printed circuit cables have been manufactured by etching out conductors on copper sheets laminated to a flexible, thermoplastic. The etched out conductors are then cover coated to insulate them more fully from each other and from mechanical wear and moisture. This covercoat is generally bonded to the conductors and insulating base by means of heat and pressure. It is, particularly, during the cover-coating operation that the spacial relationship of the conductors begins to vary.

It is, therefore, an object of the present invention to provide an improved method of laminating conductors in a predetermined configuration to a thermoplastic material.

It is a further object of this invention to provide an improved flexible printed circuit cable.

Yet another object of this invention is to provide an improved flexible printed circuit cable having a planar conductor configuration, the spacial relationship of which can be accurately maintained during lamination under heat and pressure to a thermoplastic insulating cover coat.

In accordance with the present invention there is provided a method of controlling lateral displacement of conductors in a predetermined configuration during lamination to a thermoplastic material. In accordance with the method, a sheet of copper is laminated under heat and pressure to a thermoplastic material. The copper is etched to form a desired conductive configuration and is bounded on at least two sides by a margin of copper residue. The margin of copper residue minimizes lateral displacement of the conductor configuration during lamination of a thermoplastic cover coat. A thermoplastic cover coat is laminated to the conductors under heat and pressure to encapsulate the conductors in an insulating medium.

2

As used herein, the term "plastic" includes a synthetic organic material of high molecular weight, and which, while solid in the finished state, at some stage in its manufacture is soft enough to be formed into shape by some degree of flow.

The well-known term "Kel-F" as used herein is the trademark of the M. W. Kellogg Company and refers to the plastic polymonochlorotrifluoroethylene as manufactured by them.

The well-known term "Teflon" as used herein is the trademark of the E. I. du Pont de Nemours & Co., Inc. and refers to the plastic polymer tetra-fluoroethylene as manufactured by them.

The term "ethylene" includes all those plastic materials containing an ethylene radical, and the term "vinyl" includes all those plastic materials containing a vinyl radical.

The term "Saran," trademark of the Dow Chemical Company, is used herein to denote those plastic materials containing a vinylidine radical.

The term "nylon" as used herein refers generically to the group of plastic materials known as polyamides.

For a better understanding of the present invention, together with other and further objects thereof, reference is made to the following description taken in connection with the accompanying drawings and its scope will be pointed out in the appended claims.

Figure 1:
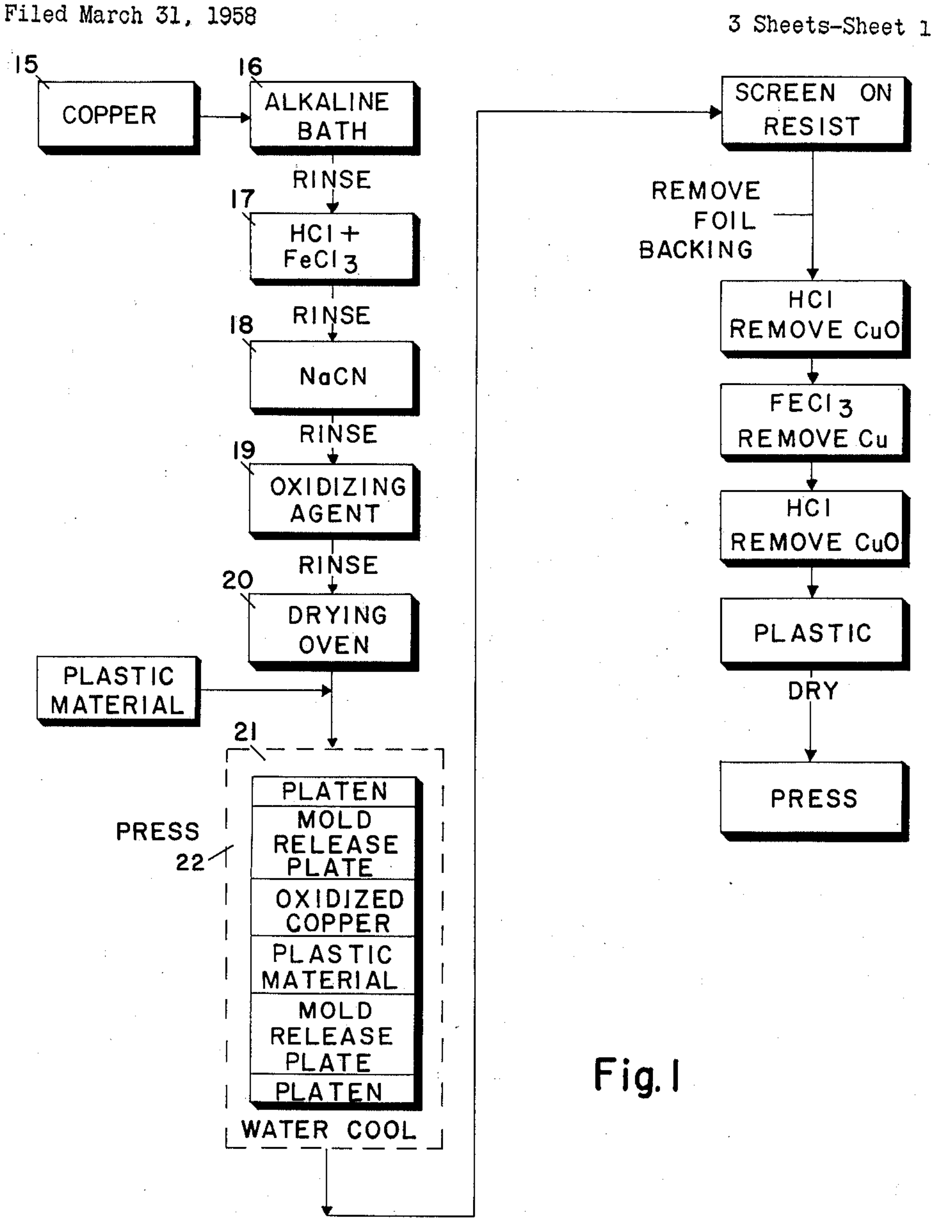
Fig. 1 is a flow chart illustrating a preferred process for manufacturing a flexible printed circuit.

Referring now to the drawings and with particular reference to Fig. 1, a method of laminating conductors in a predetermined configuration to a thermoplastic material will be described. While applicant does not intend to be limited to any particular materials in the application of the method of this invention, the combination of copper conductors with polymonochlorotrifluoroethylene insulation has been found to be particularly useful. The method of laminating copper conductors to polymonochlorotrifluoroethylene sheets is carried out in detail in the following manner:

Sheets of copper 15 are:

(1) Immersed in a mild alkaline bath 16 such as Dy-Clene EW Metal Cleaner, as manufactured by MacDermid, Inc., Waterbury, Connecticut, for five seconds;

(2) Rinsed in cold, running water for five seconds;

(3) Dipped for 15 seconds in a 10 percent solution of hydrochloric acid (HCl) 17 containing a small amount of ferric chloride ($FeCl_3$);

(4) Rinsed in cold, running water for five seconds;

(5) Immersed in a 10 percent solution 18 of sodium cyanide (NaCN) for 15 seconds and then rinsed;

(6) Immersed for 10 minutes at 190° F.–210° F. in an oxidizing agent 19, such as an aqueous solution of 1 and ½ pounds per gallon of water of Ebonol "C" Special, as manufactured by Enthone Company, New Haven, Connecticut. The oxidizing agent is preferably a hot aqueous solution consisting essentially of an alkali selected from the group consisting of sodium hydroxide and potassium hydroxide and a chlorite selected from the group consisting of sodium chlorite and potassium chlorite;

(7) Immersed in cold, running water;

(8) Rinsed in hot, running water for 10 to 20 seconds; and (9) Baked in a preheated oven 20 at a temperature above 212° F. until all traces of moisture are removed.

These steps result in providing a sheet of copper having a cupric oxide surface obtained by utilizing a chemical agent rather than by applying heat as in the prior art. The cupric oxide obtained in the manner described in steps 1 to 9 above is quite different from that obtained by heating. It appears as a homogeneous, velvety black coating. The black is intense. Under a microscope of greater than 300 power, the crystals of oxide appear fine and needle-like and are much smaller than those obtained when copper is heated. Further, and probably most important, this cupric oxide differs from that obtained by heating in that it is tightly bonded to the copper and will not flake off.

The copper sheets obtained by means of steps 1 to 9 above are now ready for lamination to a thermoplastic. The lamination process is, for example, as follows:

(10) Place a sheet of thin, metallic foil mold release plate, such as aluminum, on the platen of a press 22, such as manufactured by Wabash Press Company, Wabash, Indiana; the aluminum foil is used to prevent adherences between the polymonochlorotrifluoroethylene and the platen;

(11) Place a sheet of thermoplastic material on the platen 21 of the press 22. The thermoplastic may be, for example, polymonochlorotrifluoroethylene of a size, for example, 6 inches long, 2 inches wide and 2 mils thick. The temperature of the oven is, for example, 400° C.;

(12) Place a sheet of copper, coated in accordance with steps 1 to 9 on top of the polymonochlorotrifluoroethylene layer and apply an initial pressure of approximately 5 pounds per square inch, gradually increasing the pressure;

(13) Bake under pressure at 216° C. to 219° C. for 40 seconds;

(14) Remove the copper clad plastic from the press and quench in cold water; and

(15) Remove the aluminum foil.

This process provides a thermoplastic copper clad which may be used for any of a number of purposes. Though definite pressures and temperatures are mentioned above, the pressures, times and temperatures are interrelated and vary also with the thickness, area and type of plastic material used. Generally, the temperature is in the range of 215° C.–300° C., the initial pressure being of the order of 5 pounds per square inch but building up to higher pressures which may be of the order of hundreds of pounds per square inch. The parameters are time-temperature, primarily and, to some degree, time and temperature, in terms of the pressure applied, may be interchanged.

The thermoplastic can, of course, be copper clad on both sides merely by placing sheets of copper both above and below the thermoplastic. Similarly, a number of sheets of thermoplastic may be intermixed with cupric oxide coated sheets of copper to form a laminated structure.

Another method for effecting the bond involves the use of a rotary press. The rollers are heated to a temperature of 215° C. to 250° C. and thermostatically maintained. The copper-thermoplastic bond is effected by covering a sheet of thermoplastic, such as polymonochlorotrifluoroethylene with two sheets of cupric oxide coated copper and introducing the composite article between the rollers. Preferably, the rollers are spaced so as to apply a positive pressure greater than 5 pounds per square inch, and are rotated at such a rate as to provide a linear speed of, for example, 10 inches per minute, to the sheets.

The bonding time varies with the mass of the supporting plate in the press and the starting temperature of the press. By using very thin material, very small coils of transmission line, transformers and chokes may be produced. For example, a strip of the material 7 and ¼ inches long by .002 inch thick with a .00135 inch copper conductor, may be rolled into a coil having a diameter of 3/16 of an inch. In one application of the present invention, a cable one inch wide contains 21 conductors with 42 separate terminations at either end. In this application the conductors were encapsulated in polymonochlorotrifluoroethylene affording an extremely tough and flexible cable.

A modified form of the improved method of bonding polymonochlorotrifluoroethylene to copper involves the use of powdered polymonochlorotrifluoroethylene which is spread on top of a sheet of cupric oxide covered copper. For unplasticized powder of high molecular weight the operating temperature range may be as high as 300° C. After placing the powder in contact with the copper (and, if desired, applying another sheet of copper on top of the powder), the press is closed at the rate of 0.2 inch per minute until the desired thickness is obtained as determined by gauge blocks. By shining a light through the material a color change will be observed from pink to white. After the white light appears the press is held in place for 15 to 30 seconds, depending upon the thickness of the material desired. The composite sheet thus obtained is then quenched in cold water or transferred to a cold press. In both processes immediate quenching produced crystallization and thus a relatively high degree of transparency. Other layers of thermoplastic can be added as desired.

The bond strengths obtained as measured by delaminating a one inch strip of copper from the polymonochlorotrifluoroethylene are consistently greater than 8 pounds per inch. Bond strengths of 18 pounds per inch and higher are obtainable. For example, laminates prepared by starting with the polymonochlorotrifluoroethylene powder as indicated above are characterized by bond strengths which are consistently in excess of 15 pounds per inch.

As an example of another thermoplastic that may be employed with the method of the present invention, there follows a description of a bonding technique for use with tetra-fluoro-ethylene. Using the same apparatus and general procedure as outlined in Fig. 1, and differing only in the thermoplastic to copper bonding process, a thin sheet of Teflon, for example under .010 inch thick, is placed in contact with a sheet of cupric oxide coated copper foil, for example 2 ounce copper, and placed in the press 22. The thermoplastic-copper laminate is preheated at approximately 700° F. for several minutes and then pressed at that temperature and in the order of 250 pounds per square inch pressure for about 6 minutes. The laminate is then water cooled in the press under continued pressure. Bond strengths have been observed as high as 8 pounds per inch.

A number of compounds which typify large classes of plastic materials have been laminated to cupric oxide coated copper in the manner suggested above. The temperature, pressure, preheat time under slight pressure, heating time under pressure, the thickness of copper used, the thickness of the plastic and the resultant peel strengths are tabulated on the following page for a number of materials utilized.

*Parameters for bonding copper to plastic*

| | Temp. of Materials (° C.) | Pressure (Lbs./In.[2]) | Time of Preheat (Min.) | Min. Time in Press (Min.) | Thickness of Copper ($10^{-3}$ In.) | Thickness of Plastic ($10^{-3}$ In.) | Peel Strength (Grs./In.) |
|---|---|---|---|---|---|---|---|
| Ethylenes: | | | | | | | |
| Polyethylene | 127 | 70-80 | 1 | 4 | 1.35 | ---------- | [2] >3,000 |
| Kel-F | 234 | 120-150 | 5 | 6 | 1.35 | 10 | 4,200 |
| Teflon [1] | 380 | 120-150 | 5 | 6 | 2.70 | 10 | 1,650 |
| Vinyls: | | | | | | | |
| Polyvinyl Chloride | 220 | 120-150 | 1 | 4 | 1.35 | 10 | 3,100 |
| Polyvinyl Butyral | 193 | 120-150 | 1 | 4 | 2.70 | 8.5 | 3,300 |
| Polyvinyl Acetate | 200 | 120-150 | 1 | 4 | 2.70 | 10 | 3,100 |
| Polyvinyl Alcohol [1] | 205 | 325-350 | 1 | 4 | 2.70 | 11 | 5,500 |
| Saran: | | | | | | | |
| Polyvinylidene Chloride | 180 | 120-150 | 1 | 4 | 2.70 | 12 | (3) |
| Polyvinylidene Styrene | 205 | 120-150 | 5 | 6 | 2.70 | 31 | 2,500 |
| Polyamides: | | | | | | | |
| Nylon NC-10 [1] | 250 | 325-350 | 5 | 6 | 1.35 | Crystals | 4,000 |
| Cellulosics: | | | | | | | |
| Cellulose Acetate [1] | 193 | 120-150 | 1 | 4 | 2.70 | 30 | 7,260 |
| Acrylics: | | | | | | | |
| Methyl Methacrylate [1] (Plexiglas) | 250 | 325-350 | 5 | 6 | 2.70 | 66 | 2,000 |
| Rubber Hydroxide [1] | 122 | 120-150 | 1 | 4 | 1.35 | 9 | Decomposes |

[1] Press—water cooled.
[2] Tearing of polyethylene.
[3] Turned brown—tearing of material at 1500 grams.

The thermoplastic-copper bonding mechanism is not thoroughly understood. However, as a result of much experimentation and analysis, it is believed that the bonding mechanism is essentially mechanical. One basic requirement seems to be that the thermoplastic material must flow fairly readily without decomposing. As indicated in the previous table, some of the materials tend to decompose before the desired melt-viscosity is reached even though a satisfactory bond may still be obtained. In the case of some forms of Teflon, the degree of plasticity increases with temperature, but the material tends to decompose before it reaches a suitable flow point. It will be apparent, however, that while a degree of flow is necessary to cause the plastic material to fill the interstices formed by cupric oxide needles, more or less randomly oriented, a good bond is obtainable even though ideal flow conditions are not realized. In the case of the polyvinyl material it has been frequently observed that the bond is stronger than the plastic material itself. Thus, for polyvinyl chloride and polyvinyl acetate the peel strength is indicated on the order of 3000 grams. This is the pulling force at which the plastic material broke.

To manufacture a component of an electric circuit, the copper of the article prepared in the manner described above may be treated as indicated in the remainder of the flow chart of Fig. 1. A resist is placed on the copper in the pattern of a desired configuration and the excess copper removed by a suitable etching technique. The remaining resist is removed and the circuit may be encapsulated by placing a sheet of thermoplastic in contact with the coated copper and sealing by means of a press in the manner described above. It is during this sealing step that the spacial relationship of the conductors is most prone to vary. The reason for this is, of course, the natural tendency of the thermoplastic material to flow under heat and pressure.

Figure 2:
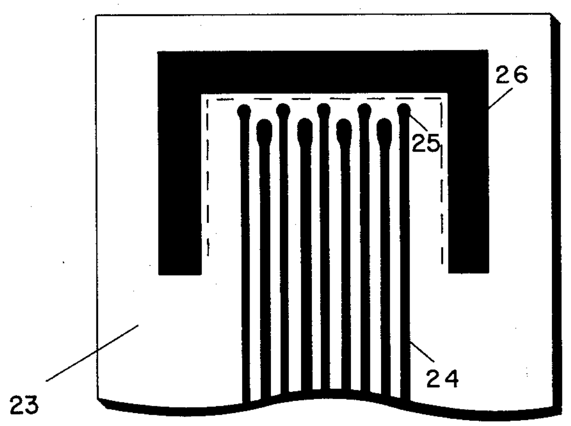
Fig. 2 is a plan view of a portion of a flexible printed circuit cable having a non-thermoplastic border in the vicinity of the conductor terminals to stabilize the terminal spacing during lamination.

Referring now to Fig. 2 of the drawings, there is here shown a flat, flexible, printed circuit cable 23 having conductors 24 and terminals 25. The terminals 25 are disposed in the same plane to register with the corresponding terminals of an electrical component to be connected. In the vincinity of and coplanar with the terminals 25 is a non-thermoplastic border 26 which effectively inhibits spreading of the terminals 25 and conductors 24 when cover coating with or laminating to a thermoplastic material. For optimum results this border 26 should be wider than the individual conductors 24 and should be positioned relative to the conductors 24 so as to be perpendicular to the conductive path of the conductors 24 at one point and parallel to the conductive path of the conductors 24 at another point. Furthermore, the border 26 is situated as close as possible to the conductors 24 leaving only enough space between the conductors 24 and the border 26 to provide a plastic edge adequate for protection and insulation of the conductors 24 when the border 26 is trimmed off. For conveience, the border 26 may be formed from the same materials as the conductors 24. This is the case in the embodiment of Fig. 3; however, other materials that might be used to form the border 26 include, for example, phenolic plastics, other metals and ceramic materials.

Figure 3:
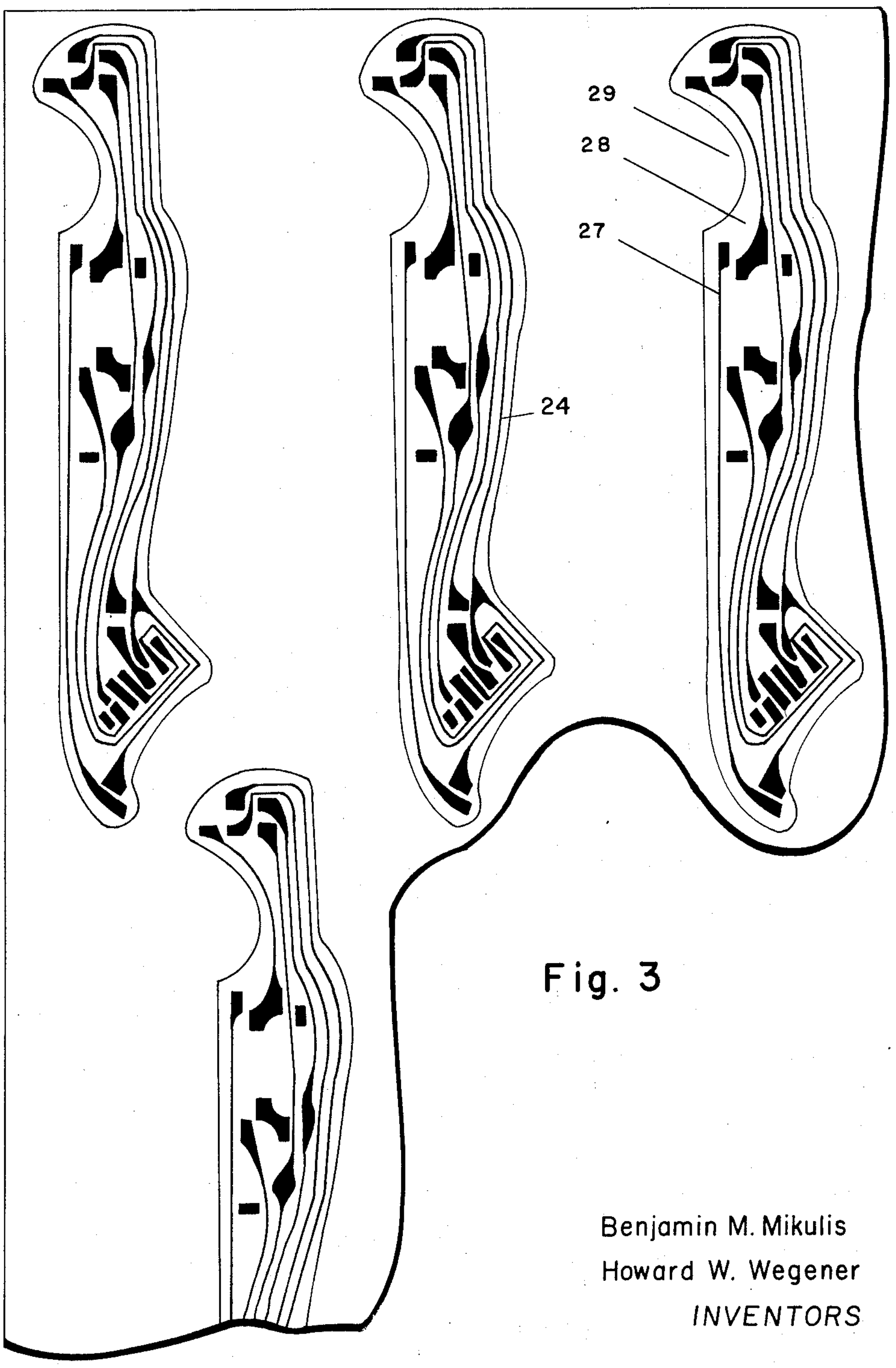
Fig. 3 is a plan view of a repeating, flexible, printed circuit conductor configuration, illustrating scrap retention to control the conductor spacing during lamination.

In Fig. 3 there is illustrated a repeating conductor configuration 27, laminated to a thermoplastic material 28. When the conductors 24 are etched out, the copper scrap 29 is not removed but is retained to serve as an extension barrier to prevent movement of the conductors 24 during lamination. The scrap 29 may be removed after lamination by means of die stamping or other suitable techniques; likewise, the non-thermoplastic border 26 in Fig. 2 may be removed by stamping or by cutting along the dashed lines adjacent the inner periphery of the border 26.

Figure 4:
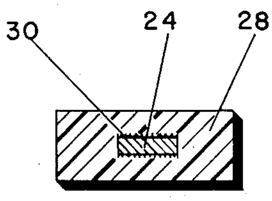
Fig. 4 is an elevational view in cross section of a flexible printed circuit conductor.

Fig. 4 is an elevational view in section, more particularly illustrating the finished laminate structure of a flexible, printed circuit cable conductor, showing in cross section the copper conductor 24, the cupric oxide coating 30, and the thermoplastic insulation 28. As heretofore stated, thermoplastic materials that have been successfully employed in carrying out the method of the present invention include polyethylene, Teflon, polyvinyl acetate and polyvinyl chloride; however, it is believed that this method applied broadly to all thermoplastics and applicant does not intend to be limited to those cited in the examples.

The present invention represents an important step forward in the art of printed circuitry, in that the flexibility properties of thermoplastic materials may be successfully utilized in combination with techniques of printed circuitry to produce electrical articles of superior characteristics.

While there has been described what are at present considered to be the preferred embodiments of this invention, it will be obvious to those skilled in the art that various changes and modifications may be made therein without departing from the invention, and it is, therefore, aimed in the appended claims to cover all such changes and modifications as fall fairly within the true spirit and scope of the invention.

What is claimed is:

1. A method of laminating conductors in a predetermined configuration to a thermoplastic material which comprises: laminating a sheet of cupric oxide coated copper under heat and pressure to a thermoplastic material; etching said copper to form a desired conductor configuration surrounded by a margin of unetched copper in the same plane as said conductor configuration to preserve said conductor configuration during lamination thereto of a thermoplastic cover coat; and lamniating a thermoplastic cover coat to said conductors under heat and pressure to encapsulate said conductors in an insulating medium.

2. A method of laminating conductors in a predetermined configuration to a thermoplastic material which comprises: laminating a sheet of cupric oxide coated copper under heat and pressure to a thermoplastic material; etching said copper to form a desired conductor configuration surrounded by a margin of unetched copper in the same plane as said conductor configuration to preserve said conductor configuration during lamination thereto of a thermoplastic cover coat; laminating a thermoplastic cover coat to said conductors under heat and pressure to encapsulate said conductors in an insulating medium; and trimming off said margin of unetched copper.

3. A method of controlling lateral displacement of conductors in a predetermined configuration during lamination to a thermoplastic material which comprises: laminating a sheet of copper under heat and pressure to a thermoplastic material; etching said copper to form a desired conductor configuration bounded on at least two sides by a margin of copper residue to minimize the lateral displacement of said conductor configuration during lamination thereto of a thermoplastic cover coat; and laminating a thermoplastic cover coat to said conductors under heat and pressure to encapsulate said conductors in an insulating medium.

4. A method of controlling lateral displacement of conductors in a predetermined configuration during lamination to a thermoplastic material which comprises: laminating a sheet of solution oxidized copper under heat and pressure to a thermoplastic material, etching said copper to form a desired conductor configuration bounded on at least two sides by a margin of copper residue to minimize the lateral displacement of said conductor configuration during lamination thereto of a thermoplastic cover coat; and laminating a thermoplastic cover coat to said conductors under heat and pressure to encapsulate said conductors in an insulating medium.

5. A method of controlling lateral displacement of conductors in a predetermined configuration during lamination to a thermoplastic material which comprises: laminating a sheet of cupric oxide coated copper under heat and pressure to a thermoplastic material; etching said copper to form a desired conductor configuration bounded on at least two sides by a margin of copper residue to minimize the lateral displacement of said conductor configuration during lamination thereto of a thermoplastic cover coat; and laminating a thermoplastic cover coat to said conductors under heat and pressure to encapsulate said conductors in an insulating medium.

6. A method of controlling lateral displacement of conductors in a predetermined configuration during lamination to a thermoplastic material which comprises: laminating a sheet of copper under heat and pressure to a thermoplastic material: etching said copper to form a desired conductor configuration; positioning two coplanar non-thermoplastic members, interconnected by a restraining member, in the plane of said conductors, said coplanar members being substantially elongated in a direction transverse to said lateral displacement of said conductors during lamination thereto of a thermoplastic cover coat; and laminating a thermoplastic cover coat to said conductors under heat and pressure to encapsulate said conductors in an insulating medium.

References Cited in the file of this patent

UNITED STATES PATENTS

| | | |
|---|---|---|
| 2,551,591 | Foord | May 8, 1951 |
| 2,692,190 | Pritikin | Oct. 19, 1954 |
| 2,745,898 | Hurd | May 15, 1956 |